(12) United States Patent
Roe

(10) Patent No.: US 8,447,553 B1
(45) Date of Patent: May 21, 2013

(54) EXPERT SYSTEM RELIABILITY ASSISTANCE FOR ELECTRONICS

(76) Inventor: Kevin Roe, San Jose, CA (US)

( * ) Notice: Subject to any disclaimer, the term of this patent is extended or adjusted under 35 U.S.C. 154(b) by 400 days.

(21) Appl. No.: 12/841,552

(22) Filed: Jul. 22, 2010

(51) Int. Cl.
*G01P 21/00* (2006.01)

(52) U.S. Cl. .......... 702/108; 702/57; 702/117; 702/189

(58) Field of Classification Search .......... 714/25, 714/27, 48; 702/57, 108, 117, 189; 422/83; 340/500, 573.1, 632
See application file for complete search history.

(56) References Cited

U.S. PATENT DOCUMENTS

| | | | |
|---|---|---|---|
| 4,967,337 A | * | 10/1990 | English et al. .................. 700/79 |
| 5,107,500 A | * | 4/1992 | Wakamoto et al. ............. 714/26 |
| 5,819,208 A | * | 10/1998 | Carter ........................... 702/182 |
| 6,530,049 B1 | | 3/2003 | Abramovici et al. |
| 7,214,939 B1 | | 5/2007 | Wong et al. |
| 7,319,405 B2 | | 1/2008 | Hofbeck et al. |
| 7,320,030 B2 | | 1/2008 | Brown |
| 7,437,644 B2 | | 10/2008 | Ginggen et al. |
| 7,472,320 B2 | | 12/2008 | Berndlmaier et al. |
| 2005/0125197 A1 | | 6/2005 | Duron et al. |
| 2007/0194922 A1 | | 8/2007 | Nathan et al. |

* cited by examiner

*Primary Examiner* — Elias Desta
(74) *Attorney, Agent, or Firm* — Kevin Roe

(57) ABSTRACT

Methods and systems using one or more expert systems to increase electronic device reliability. One embodiment is a method to screen an electronic device by one or more expert systems to detect a potential failure of the electronic device, selectively testing the electronic device when the screening indicates a potential failure, and providing one or more outputs if the selective testing of the electronic device indicates a failure. A second embodiment is a system to screen an electronic device by one or more expert systems to detect a potential failure, selectively testing the electronic device when the screening indicates a potential failure and providing one or more outputs if the selective testing of the electronic device indicates the failure.

20 Claims, 16 Drawing Sheets

EXPERT SYSTEM RELIABILITY ASSISTANCE FOR ELECTRONICS

BACKGROUND OF THE INVENTION

1. Field of the Invention

This invention relates generally to increasing the reliability of electronic devices, and more specifically to increasing the reliability of electronic devices by utilizing one or more expert systems.

2. Description of the Prior Art

Any applications for electronics can benefit from an increase in reliability. But some applications for electronics especially need an increase in reliability, such as when human safety is concerned. People at locations (e.g., buildings, tunnels, bridges, factories, refineries, hospitals, ski slopes, public transportation vehicles, such as buses, subways, trains, planes, and ships, and other large structures) in emergency situations needlessly continue to suffer many thousands of deaths and injuries each year around the world. Although electronic devices have been devised that alert people at a location by an alarm to an unsafe condition (e.g., fire, combustion gases such as carbon monoxide, carbon dioxide, and so forth), people have generally been forced to rely on the reliability of critical electronic devices in determining whether a threat to human safety exists and what their safest course of action would be.

Such failures, particularly in relatively risky locations, such as in airplanes, high speed vehicles, battlefields, hostile environments (e.g., high temperature environments, poisonous environments, high radiation environments, and equivalents), tunnels, bridges, factories, refineries, hospitals, or public transportation vehicles (such as buses, subways, trains, airplanes, ships, and equivalents), may require extremely prompt and reliable operation of electronic devices and fast choices by people in determining their safest course of action in an emergency situation, such as a fire, collision, explosion, violent attack, gas release, flooding, avalanche, lightning, hurricane, tornado, tsunami, earthquake, volcanic eruption, medical emergency, or other unexpected emergency. There may not be enough time for people to determine whether or not a critical electronic device is actually reliable and correct in an assessment of a situation. Failures of critical electronic devices are more likely to be fatal in dangerous locations and situations, so the need for obtaining a correct output is even greater.

U.S. Pat. App. No. 2007019422 published by Nathan, et al., on Aug. 23, 2007, discloses a method and system for a building warning system. The building safe warn generally related to warning or otherwise alerting people to hazards or other conditions in the building. The warnings may be generated as a function of the position of the person in the building and/or the location of a hazard so as to facilitate safely evacuating people from the building. The location of the people may be reported to emergency response entities to facilitate person discovery and rescue. The disclosures of this patent application are hereby incorporated by reference.

U.S. Pat. App. No. 20050125197 published by Duron, et al., on Jun. 9, 2005, discloses a system and method for detecting and monitoring structural damages which are irreversible and which lead to inevitable collapse of a building or location. The system includes at least one accelerometer that is housed in a device that is mounted on an exterior surface outside the burn area, and within the reach of the rescue worker. The device communicates with a remote display that provides visual and/or audible signals to indicate imminent collapse at the location. Additionally, the system includes collapse detecting analysis processes for determining the likelihood of collapse. The disclosures of this patent application are hereby incorporated by reference.

U.S. Pat. No. 7,472,320 issued to Berndlmaier, et al., on Dec. 30, 2008, discloses a method and apparatus for autonomously self-monitoring and self-adjusting the operation of an integrated circuit device throughout the integrated circuit device's useful life. The invention periodically performs performance self-testing on the integrated circuit device throughout the integrated circuit device's useful life. The invention also evaluates whether results from the self-testing are within acceptable limits and self-adjusts parameters of the integrated circuit device until the results from the self-testing are within the acceptable limits. The disclosures of this patent are hereby incorporated by reference.

U.S. Pat. No. 7,437,644 issued to Ginggen, et al., on Oct. 14, 2008, discloses a transcutaneous energy transfer (TET) system that performs automatic, periodic self-testing functionality of multiple components of the implantable medical device, preferably all components whose malfunction could negatively impact the health of the patient, without triggering from an external device. Simultaneous self-testing of multiple components, preferably all components whose malfunction could negatively impact the health of the patient, on an automatic, periodic basis minimizes energy consumption. The disclosures of this patent are hereby incorporated by reference.

U.S. Pat. No. 7,320,030 issued to Brown on Jan. 15, 2008, discloses a remote health monitoring apparatus using scripted communications, e.g., generating a script program from a set of queries. The script program is executable by a remote apparatus that displays information and/or a set of queries to the individual through a user interface. Responses to the queries that are entered through the user interface together with individual identification information are sent from the remote apparatus to the server system across a communication network. The server system also includes an automated answering service for providing a series of questions from a stored set of questions for an individual at the remote apparatus to respond to, storing responses to each provided question in the series of questions and providing a service based on the individual's response to the questions. The disclosures of this patent are hereby incorporated by reference.

U.S. Pat. No. 7,319,405 issued to Hofbeck, et al., on Jan. 15, 2008, discloses a method for self-diagnosis of a system, in particular for seat occupancy detection in an automotive vehicle, in order to control deployment of an airbag in the event of an accident, for example as a function of the corresponding seat occupancy. The disclosures of this patent are hereby incorporated by reference.

U.S. Pat. No. 7,214,939 issued to Wong, et al., on May 8, 2007, discloses a fire detector and method for generating an alarm signal in response to a fire that uses an NDIR carbon dioxide sensor to generate an alarm signal when a signal processor receives the detector signal and a pre-selected criterion is met that is indicative of the onset of a fire based upon an analysis of the detector signal using a detection algorithm that relies upon a trending pattern of the detector signal, such as recognizing a substantial drop in the detector signal strength. The disclosures of this patent are hereby incorporated by reference.

U.S. Pat. No. 6,530,049 issued to Abramovici, et. al. on Mar. 2, 2003, discloses a method of fault tolerant operation of field programmable gate arrays (FPGAs) utilizing incremental reconfiguration during normal on-line operation includes configuring an FPGA into initial self-testing areas and a working area. Within the self-testing areas, programmable logic blocks (PLBs) of the FPGA are tested for faults. Upon the detection of one or more faults within the PLBs, the faulty PLBs are isolated and their modes of operation exhaustively tested. Partially faulty PLBs are allowed to continue operation in a diminished capacity as long as the faulty modes of operation do not prevent the PLBs from performing non-faulty system functions. After testing the programmable logic blocks in the initial self-testing areas, the FPGA is reconfigured such that a portion of the working area becomes a subsequent self-testing area and at least a portion of the initial self-testing area replaces that portion of the working area. In other words, the self-testing area roves around the FPGA repeating the steps of testing and reconfiguring until the entire FPGA has undergone testing, or continuously. The disclosures of this patent are hereby incorporated by reference.

While many of the systems in the prior art cleverly and impressively attempt to handle failures or alert people to dangers, such systems ultimately depend on the accuracy of the function of their electronic devices, with or without redundant electronics to provide operational fault tolerance (e.g., Triple Module Redundancy (TMR), and equivalent redundant electronic systems). Furthermore, any electronic device is more likely to fail after the Mean-Time-To-Failure (MTTF) of the electronic device has been reached, or when an unusual event damages the electronic device itself.

Furthermore, even electronic devices with sophisticated redundancy such as TMR will become error prone when the probability of failure of one of the triple modules becomes greater than 0.5. Then the probability of failure for at least two out of the three modules will become greater than 0.5. In other words, the redundancy will amplify the probability of a false output when each component becomes more likely to be operating incorrectly. This is very critical for human safety, because then a system, even a redundant system, will have a significant likelihood of incorrectly detecting failure when there is actually no failure (i.e., a false positive), or incorrectly missing failure when there is a real failure (i.e., a false negative). Furthermore, such systems may be called upon in an emergency to warn or save a person during the occurrence of a potentially dangerous event (e.g., a structural failure, fire, some type of violence, poisoning, collision, explosion, or other environmental compressions or decompressions, avalanche, lightning, hurricane, tornado, tsunami, flooding, earthquake, volcanic eruption, medical emergency, or any other dangerous event). What is needed is a system that increases the reliability of such critical electronic devices to overcome these problems with a screening and selective testing approach to increase the probability of providing a correct output even when an electronic device, with or without redundancy, is failing to provide a correct output.

SUMMARY OF THE INVENTION

The present invention overcomes the problems of the prior art by using an expert system approach to increase the reliability of electronic devices in general, or when electronic devices are important in (e.g., advising and/or rescuing) people at a risky situation (e.g., buildings, tunnels, bridges, factories, refineries, hospitals, recreational areas, ski slopes, public transportation vehicles, such as buses, subways, trains, airplanes, ships, and other large structures). Embodiments of the invention can be implemented in numerous ways. Three aspects of the invention are described below.

A first aspect of the invention is directed to a method to increase electronic device reliability. The method includes screening an electronic device by an expert system to detect potential failure; selectively testing the electronic device when the screening indicates potential failure; and providing an output if the selective testing of the electronic device indicates potential failure.

A second aspect of the invention is directed to a system to increase the reliability of an electronic device. The system includes a screening module to detect potential failure of an electronic device and selectively test the electronic device when potential failure of the electronic device is detected, wherein the screening module includes one or more expert system modules in screening the electronic device, and a response module to provide an output if the selective testing at the electronic device indicates the failure of the electronic device.

DETAILED DESCRIPTION OF THE PREFERRED EMBODIMENT

Figure 1:
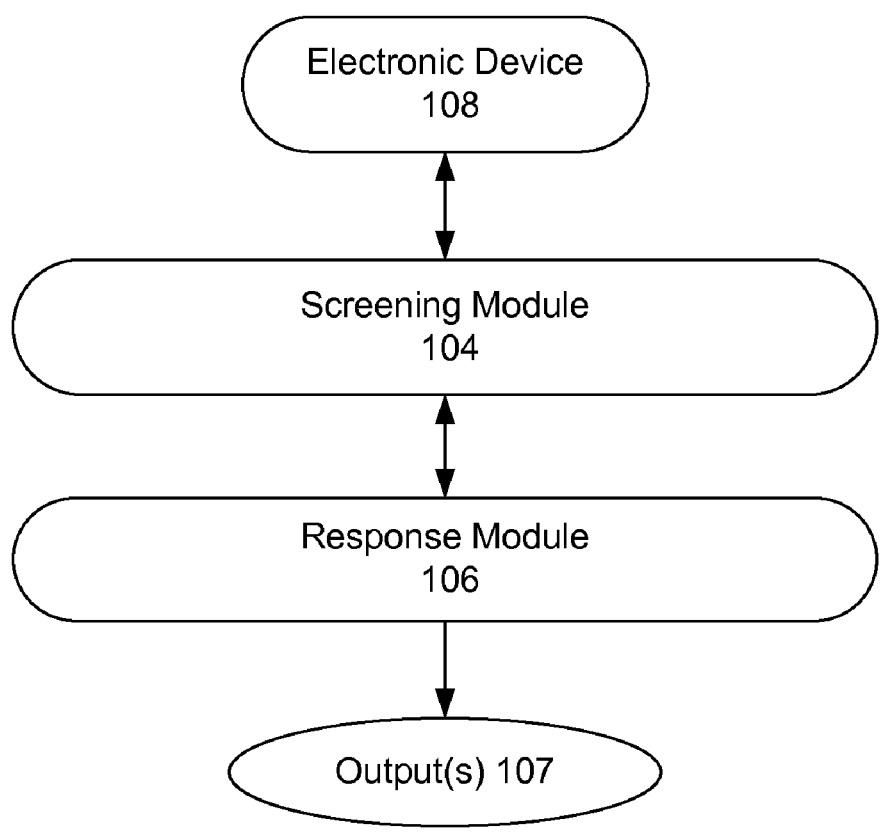
FIG. 1 illustrates a module diagram of a system to increase the reliability of electronic devices, in accordance with one embodiment of the invention.

The present invention includes various operations and/or modules, which will be described below. The operations of the present invention may be performed by hardware components or may be embodied in machine-executable instructions, which may be used to cause a general-purpose or special-purpose processor programmed with the instructions to perform the operations. In certain embodiments, the method may be performed by processing logic that may comprise hardware (e.g., dedicated logic, programmable logic, microcode, or an equivalent), software (such as run on a general purpose computer system, a dedicated machine, or an equivalent data processing system), or a combination of both hardware and software modules.

The present invention may be provided as a computer program product, or software, that may include a machine-readable medium having stored thereon instructions, which may be used to program a computer system (or other equivalent data processing systems or electronic devices) to perform a process according to the present invention. A machine-readable medium includes any mechanism for storing or transmitting information in a form (e.g., software, processing application) readable by a machine (e.g., a computer, or an equivalent data processing system or electronic device). The machine-readable medium may includes, but is not limited to, magnetic storage medium (e.g., floppy diskette); optical storage medium (e.g., CD-ROM, DVD, or an equivalent); magneto-optical storage medium; read only memory (ROM); random access memory (RAM); erasable programmable memory (e.g., EPROM, EEPROM, or an equivalent); flash memory; electrical, optical, acoustical or other form of propagated signal (e.g., carrier waves, infrared signals, digital signals, or an equivalent); or other type of medium suitable for storing electronic instructions. The present invention may also be practiced in distributed computing environments where the machine-readable medium is stored on and/or executed by more than one data processing system.

The primary goal of any embodiment of the present invention is to screen an electronic device for failure when there is a high probability that there is a failure of the electronic device. Furthermore, the electronic device may already have some damage, such as chemical damage, gas damage, electrical damage, optical damage, thermal damage, electromagnetic damage, or mechanical or physical damage (e.g., damage from an accident, violence, or event in proximity to the electronic device, such as fire, collision, explosion, or otherwise damaging environmental decompression or compression, or equivalent conditions). Due to the great inconvenience, any practical embodiment must have a very low probability of false positives (i.e., incorrectly error flagging, overriding, or replacing an output from an electronic device because of an incorrect determination of the failure of the electronic device). Furthermore, due to the risks from a great failure, any practical embodiment must also have a very low probability of false negatives (i.e., incorrectly allowing a failing electronic device to provide a truly incorrect output because of an incorrect determination of the operational reliability of the electronic device when there is a true failure of the electronic device). An expert system screening and selective testing of an electronic device will significantly increase the accuracy of the screening and decrease both the probability of a false positive and a false negative in terms of the possible failure of the electronic device.

Various embodiments of the invention are possible, but one embodiment method includes measuring at least one type of chemical (e.g., carbon monoxide, carbon dioxide, combustion by-products, hydrocarbon vapors, nitrous oxide levels, ozone levels, or any other chemical, gas, and equivalents) in the air in proximity to an electronic device (e.g., in proximity to the electronic device, or within an enclosed space, such as a room, passageway, elevator compartment, or equivalent), wherein the chemical or gas is associated with electronic device failure or damage. Selective testing of the electronic device can proceed when the screening of the operation of the electronic device, or screening detection of at least one type of indicator (e.g., chemical, gas, electrical, mechanical, acoustic, optical, thermal, or electromagnetic phenomena) is at a sufficient level to indicate possible electronic device failure. One embodiment of the invention also includes measuring at least one characteristic of an electronic device that is associated with incorrect operation of the electronic device, such as electrical failure, chemical failure, mechanical failure, optical failure, thermal failure, or an equivalent failure. Depending of the results of the measurement of at least one characteristic of the electronic device, selective testing of the electronic device can further determine whether the electronic device has truly failed.

An electronic device is hereby broadly defined to include any electronic component, subsystem or system that utilizes at least one electronic, electrical, optical, acoustic, or electromagnetic component or transducer. Failure of an electronic device can be screened or tested in many ways. In one embodiment, one or more expert systems have a memory of prior inputs to an electronic device and the corresponding outputs produced by the electronic device. In one embodiment, this expert system memory can either be a total memory from the first day of operation of the electronic device. In another embodiment, the expert system has a smaller, shorter but constantly updated memory for a recent past history of the electronic device inputs and outputs for a period of minutes, hours, days, or months to give a known sample of inputs and good outputs by which to monitor the operational performance of the electronic device. In one embodiment, the expert system and expert system memory are protected and/or shielded from one or more phenomena that could damage the electronic device or an unprotected expert system.

The selective testing can either require the active participation and knowledge of a person (e.g., asking them questions or receiving their information), or can be done without the active participation and knowledge of the person. The selective testing of the electronic device can also increase in extent if the initial testing indicates a possible failure, such as fire, smoke, structural failure, gas release, electrical hazards, lightning, hurricane, tornado, tsunami, earthquake, flooding, avalanche, and equivalents. The selective testing of the electronic device can also increase in extent if the initial testing indicates possible failure, such as electrical failure, chemical failure, mechanical failure, optical failure, or thermal failure. The disclosures of the following patents and applications are incorporated by reference—U.S. Pat. App. No. 2007019422, U.S. Pat. App. No. 20050125197, U.S. Pat. No. 7,472,320, U.S. Pat. No. 7,437,644, U.S. Pat. No. 7,320,030, U.S. Pat. No. 7,319,405, U.S. Pat. No. 7,214,939, and U.S. Pat. No. 6,530,049.

Embodiments of the invention can be constructed from various combinations of screening modules to selectively measure various characteristics of an electronic device. The screening modules can measure a characteristic at the electronic device, such as a chemical in proximity to the electronic device, temperature of gases or objects in proximity to the electronic device, delay in operation by the electronic device to a prompt, a speed of operation of the electronic device in performing at least one task, and the consistency of operation of the electronic device in performing at least one task. In one embodiment of the invention, an electronic device is continuously tested and failing parts of the electronic device are replaced by re-programmable circuits (e.g., a Field Programmable Gate Array, or an equivalent programmable device), such as disclosed in U.S. Pat. No. 6,530,049.

Embodiments of the invention can be implemented by utilizing combinations of one or more modules (e.g., using all of a module, or using a portion of a module) already existing in a system as standard features. For example, in a typical system there is an operations module (e.g., an elevator operations module allowing the person to determine one or more functions of the elevator in a structure, an equipment operating module, or equivalent), an audio module (e.g., a sound entertainment module, or a communication module) an information module (e.g., a map display module, text display module, a visitor guide module, an information kiosk, or equivalent), an security module (e.g., a motion detector module, a burglar alarm module, or equivalent), and a climate control module (e.g., an air-conditioning module, heater module, or equivalent). Many of these modules have become very sophisticated in their interfaces and in their convenience to a person. These existing modules also can provide useful information on past and/or current electronic device operation to assist in the process of determining whether the electronic device is truly failing or not failing.

There are at least eleven major advantages to using expert system screening in conjunction with already existing modules to detect an electronic device failure. The advantages are (1) a person is much less likely to deactivate or damage existing modules because of their fundamental convenience and utility to the person, (2) if human interaction is used, a person may be already familiar and comfortable interacting with the existing modules and less likely to avoid them, (3) if human interaction is used, a person is already knowledgeable in interacting with existing modules and therefore does not need extensive additional training to interact with an entirely new module, (4) if human interaction is used, the transducers and/or person displays are more trusted by the person even while being used for screening purposes, (5) some existing modules may already have useful information about the history of the electronic device that can improve the accuracy of the determination of electronic device failure, (6) if human interaction is used, speech synthesis and/or speech recognition systems in the existing modules can be utilized in the screening of the electronic device to determine failure, or in obtaining information about any event near the electronic device from the person, (7) use of existing modules greatly reduces the screening cost, (8) overall reliability is increased, since the use of existing modules reduces the total complexity and probability of failure of the components needed for a screening, (9) less space is needed for the expert system and electronic device, (10) less electrical power is needed to conduct the screening and selective testing of the electronic device, and (11) the screening and testing can be accurately performed in a very short time (e.g., as quickly as a few nanoseconds or microseconds, depending on the complexity and needs of the situation) by skipping much slower types of screening and testing (e.g., extensive statistical evaluations, repeated tests and evaluations, and so forth).

Embodiments of the invention can be constructed using one or more data processing systems already existing in the modules listed above, in a time-sharing allocation of their available processors and memory. Such existing modules frequently have some unused memory and considerable unused processor time available after performing their existing module functions. Alternatively, one or more additional data processing systems (e.g., based on any commercially available microprocessor of any word bit width and clock speed, a control Read-Only-Memory, or a data processing equivalent) can be dedicated to combining the information gathered from one or more modules listed above, or equivalent modules.

One embodiment of the invention uses one or more expert system modules to screen and test an electronic device to determine whether or not there is a true failure of the electronic device. Such expert system modules can be executed in one or more dedicated data processing systems, and/or executed in a time-sharing allocation on one or more of the processors already existing in one or more of the modules listed above (e.g., operations module, audio module, information module, security module, climate control module, or an equivalent module). In one embodiment, an expert system module can be concentrated in one or more shielded locations for extra protection and reliability, analogous to the shielding of the human brain by the mechanically strong human skull.

One embodiment of the invention also utilizes one or more expert system modules to screen and selectively test an electronic device by one or more interactions and evaluate the responses of an electronic device to the interactions to determine whether or not there is a true failure. In certain embodiments, a person can directly and verbally request testing of an electronic device. One or more evaluations can be used to adapt or perform the screening and/or selective testing of the electronic device to more quickly and more accurately determine whether there is a true failure of the electronic device.

One embodiment of the invention also includes a screening module that permits screening and selective testing of an electronic device upon activation by one or more sensors in proximity to the electronic device and/or by a person. In one embodiment, a rescue team could interact with the invention in order to determine the true operational output of an electronic device. In one embodiment, a person (on-site or distant) can verbally or physically activate a screening of the electronic device for failure with the utilization of one or more expert systems. In certain embodiments, the screening module can be activated by events likely to lead to failure of the electronic device (e.g., fire, unusual gases, collision, explosion, hurricane, tornado, lightning, sounds associated with violence, tsunami, earthquake, volcanic eruption, floods, avalanches, and so forth).

One embodiment of the invention also includes selective testing that selectively changes according to one or more other factors, such as air temperature, oxygen levels, carbon dioxide levels, carbon monoxide levels, combustion by-product levels, nitrous oxide levels, ozone levels, hydrocarbon vapor levels, the presence of any gas associated with electronic device failure, air humidity, air pressure, collision, explosion, or other environmental compressions or decompressions, voice loudness levels, structural failures, fire, flooding, lightning, hurricane, tornado, avalanches, tsunami, earthquake, or volcanic eruption. In other words, one embodiment of the invention can use environmental phenomena to screen the electronic device for selective testing to determine a failure of the electronic device.

Failure of the electronic device may simply be flagged as a warning in one embodiment of the invention. Failure of the electronic device may cause the expert system to provide a correct output instead of the electronic device in another embodiment of the invention. Providing a correct output can include many possible types of responses, such as overriding or deactivating the output of the failing electronic device by the use of buffers, logic gating, re-programmable logic, and so forth. Providing a correct output could also include rerouting communications or signals, or assisting a person. Assisting a person (when feasible) can include one or more of the following responses: providing messages advising a person of the safest or a safer evacuation route, advising them of a second location having less failure or having emergency supplies, shielding the person from harm by outputting control signals activating mechanisms (e.g., using polymer shields, metal shields, Kevlar shields, ceramic shields, airbags, sprays, or foams to avert projectiles, collisions, explosions, lightning, fires, gases, heat, light, and so forth), changing the posture of a person (e.g., to improve blood flow to alleviate shock or bleeding, or to make a person less likely to be injured), supplying medical drugs (e.g., antidotes, analgesics, anti-inflammatory drugs, and so forth) by injection (e.g., needle, transfusion, and so forth), inhalation (e.g., releasing various medically appropriate gases in proximity to the person, depending on their medical condition), or ingestion (e.g., pills or liquids), or using or providing other medical aid (e.g., cardiac defibrillator, mask, bandages, gels, foams, liquids, and so forth) to the person, performing appropriate and feasible medical treatment (e.g., assistive respiration by selective compressions, assistive heart stimulation by electrical impulses through a defibrillator, and so forth) on the person, providing food or water, decreasing or increasing air temperature in proximity to the impaired (e.g., decreasing temperature to counteract heat from fire or explosion, or increasing temperature to counteract medical shock or cold from a significant breach of a compartment), increasing or decreasing the supply of appropriate gases (e.g., oxygen, nitrogen, nitrous oxides, carbon dioxide, halon gases or other fire-suppression gases, foams, gels, or liquids in the event of fire, collision, explosion, or other gases) in proximity to the person, sending a warning message to summon medical assistance (e.g., to ambulances, hospitals, and so forth) and/or providing more specific person location and condition information to rescue teams, contacting other entities (e.g., military, police, other government agencies, and so forth), activating a radio beacon, assuring the person of one or more remedial actions, and/or speaking to the person to minimize their panic, terror or anxiety.

In one embodiment of the invention, a correct output includes one or more of the following actions: disabling equipment in proximity to the electronic device, disabling the equipment in proximity to the electronic device after a time delay, shutting off power to the equipment, limiting operation of the equipment to a lower speed of operation, autonomously opening, closing, adjusting, activating, or de-energizing (e.g., cutting-off electricity) to a portion of equipment in proximity to the electronic device (e.g., by radio signals, optical signals, or wire signals, separately or in combination, or an equivalent means), denying entry to dangerous areas in proximity to the electronic device, rerouting communications or signals, activating an alarm, and/or sending a warning message to another entity for assistance (e.g., by radio, email, telephone, or an equivalent).

FIG. 1 illustrates a module diagram of a system to increase the reliability of electronic devices, in accordance with one embodiment of the invention. The screening module 104 screens the electronic device 108 for at least one type of failure. In one embodiment, the screening module 104 includes one or more test systems disclosed in the prior art (computerized or non-computerized) or commercially available to screen, measure, or test electronic devices or environments for normal failures, or failure-causing phenomena. Various sensors and transducers (e.g., thermometers, chemical sensors, pressure sensors, gas sensors, electrical sensors, sound sensors, electromagnetic wave sensors, radiation sensors, light sensors, accelerometers, spectrometers, visible light cameras, infrared cameras, or equivalent equipment) can be used to screen or test the electronic device 108 or its environment. In one embodiment, the screening module 104 determines whether the electronic device 108 has a failure and whether to activate various features of the response module 106. Response module 106 provides an error flag and/or one or more correct output(s) 107 and may utilize one or more mechanisms existing in or near the electronic device 108. For example, in one embodiment the response module 106 interacts with the electronic device 108 without delay. In certain embodiments, the response module 106 includes one or more automated mechanisms for implementing a response (e.g., feedback circuits, solenoids, or equivalents) and microprocessors, micro-controllers, or other types of data processing systems to control the automated mechanisms.

Figure 2:
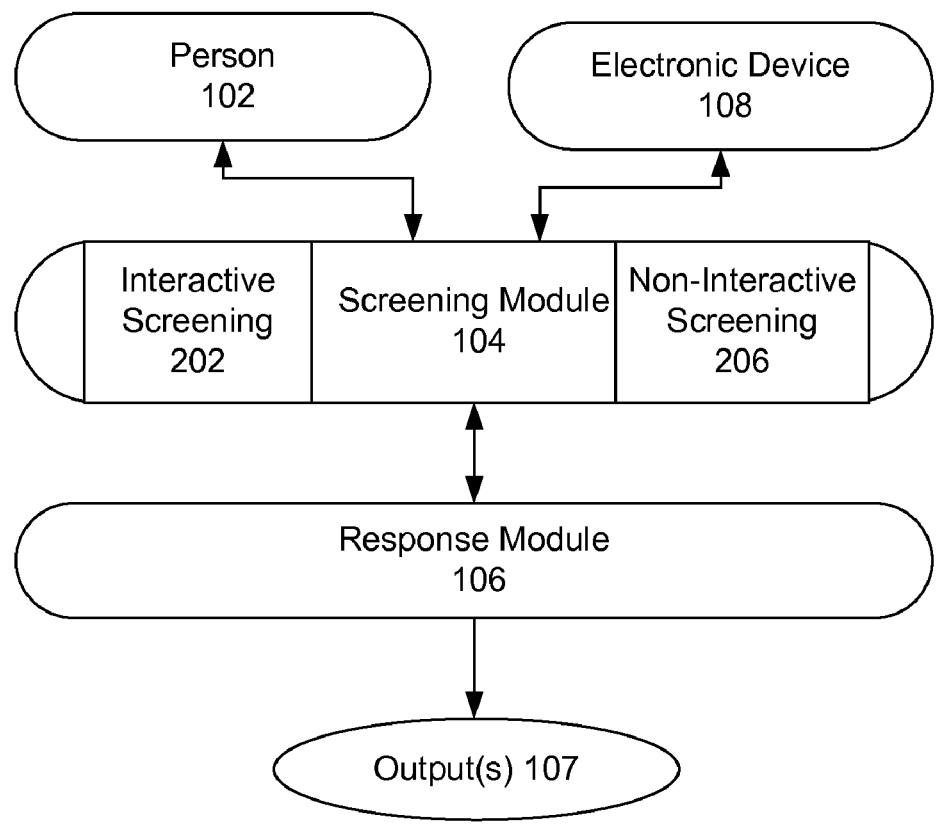
FIG. 2 illustrates a module diagram of a system to increase the reliability of electronic devices, in accordance with another embodiment of the invention.

FIG. 2 illustrates a module diagram of a system to increase the reliability of electronic devices, in accordance with one embodiment of the invention. The screening module 104 screens the electronic device 108 for at least one type of failure, such as electrical failure, chemical failure, mechanical failure, optical failure, or thermal failure. The screening module 104 determines whether the electronic device 108 has a failure and whether to activate various features of the response module 106. Response module 106 provides an error flag and/or one or more correct output(s) 107 instead of the electronic device 108 and may utilize one or more mechanisms existing in or near the electronic device 108. In this embodiment of the invention, screening module 104 includes both an interactive screening module 202 (which will screen the electronic device 108 with the conscious interaction and awareness of a person 102) and non-interactive screening module 206 (which will screen the electronic device 108 without the interaction with the person 102).

Non-interactive screening module 206 can measure a characteristic at the electronic device 108, such as a chemical in proximity to the electronic device, temperature of a gas in proximity to the electronic device 108, delay in response by the electronic device 108 to a prompt, a speed of operation of the electronic device 108 in performing at least one task, and a consistency of operation of the electronic device 108 in performing at least one task. In one embodiment, the consistency of operation of the electronic device 108 is determined by comparison of the electronic device inputs and outputs to past electronic device inputs and outputs stored in a memory (e.g., containing time samples, look-up tables, or some history of known reliable operation of the electronic device in the past for comparison) in one or more expert systems. Interactive screening module 202 can incorporate one or more features of the non-interactive screening module 206 and also ask the person 102 about the conditions of the electronic device 108 and/or the environment.

One or both of the interactive screening module 202 and non-interactive screening module 206 can also access other relevant data to consider with the screening results in determining whether there is a true failure of the electronic device. Other factors data can include one or more factors, such as air temperature, oxygen levels, carbon dioxide levels, carbon monoxide levels, combustion by-products, nitrous oxide levels, ozone levels, hydrocarbon vapor levels, the presence of any gas associated with electronic device damage, air humidity, air pressure, noises, collisions, sound loudness levels in proximity to the modules existing in or near the electronic device, explosions or other environmental compressions or decompressions, radiation, fires, flooding, avalanche, lightning, hurricane, tornado, tsunami, earthquake, volcanic eruption, and/or a history of events or operation of the electronic device.

Figure 3:
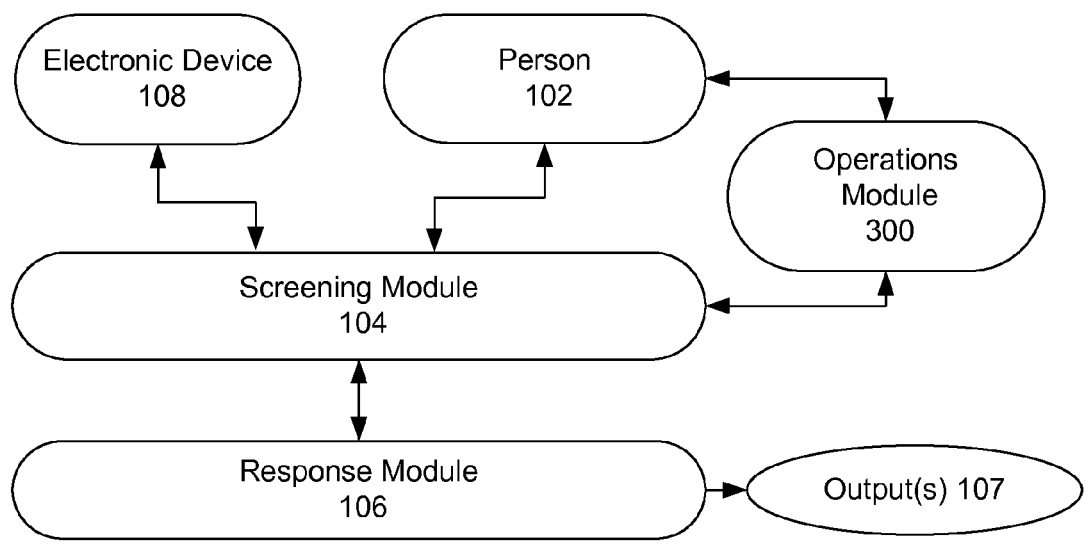
FIG. 3 illustrates a module diagram of a system to increase the reliability of electronic devices by utilizing an operations module, in accordance with another embodiment of the invention.

FIG. 3 illustrates a module diagram of a system to increase the reliability of electronic devices by utilizing an operations module, in accordance with another embodiment of the invention shown in FIG. 1. The screening module 104 screens the electronic device 108 for at least one type of failure. The screening module 104 utilizes information from operations module 300 to determine whether the electronic device 108 has a failure and whether to activate various features of the response module 106. Response module 106 optionally advises the person by one or more output(s) 107 and may utilize one or more mechanisms existing in or near the electronic device 108, using one or more of the responses listed above. The operations module 300 in some embodiments includes speech synthesis and/or speech recognition subsystems that can be integrated with little additional cost with the screening module 104 to expand the extent of the screening to include speech communication with the person 102. The operations module 300 in one embodiment also provides historical information useful for more accurately screening the electronic device 108 for failure.

Figure 4:
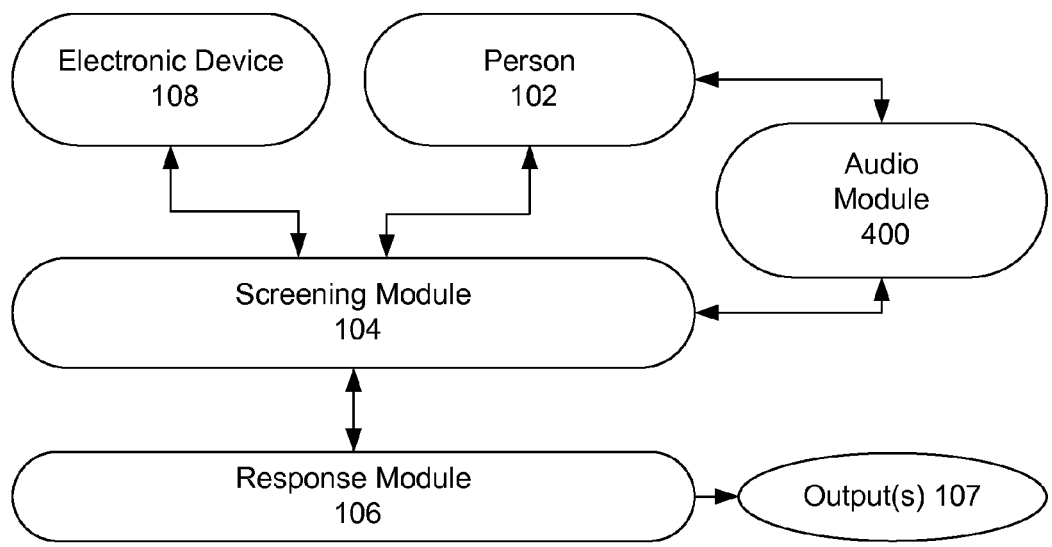
FIG. 4 illustrates a module diagram of a system to increase the reliability of electronic devices by utilizing an audio module, in accordance with another embodiment of the invention.

FIG. 4 illustrates a module diagram of a system to increase the reliability of electronic devices by utilizing an audio module, in accordance with another embodiment of the invention shown in FIG. 1. The screening module 104 screens the electronic device 108 for at least one failure and can ask a person 102 for more information. The screening module 104 utilizes information from audio module 400 to determine whether the electronic device 108 has a failure and whether to activate various features of the response module 106. Response module 106 provides a correct output and may utilize one or more mechanisms existing in or near the electronic device 108, using one or more of the assisting responses listed above. The audio module 400 in some embodiments includes speech synthesis and/or speech recognition subsystems that can be integrated with little additional cost with the screening module 104 to expand the extent of the screening to include speech communication with the person 102. The audio module 400 in one embodiment also provides historical information useful for more accurately screening the electronic device 108 for failure.

Figure 5:
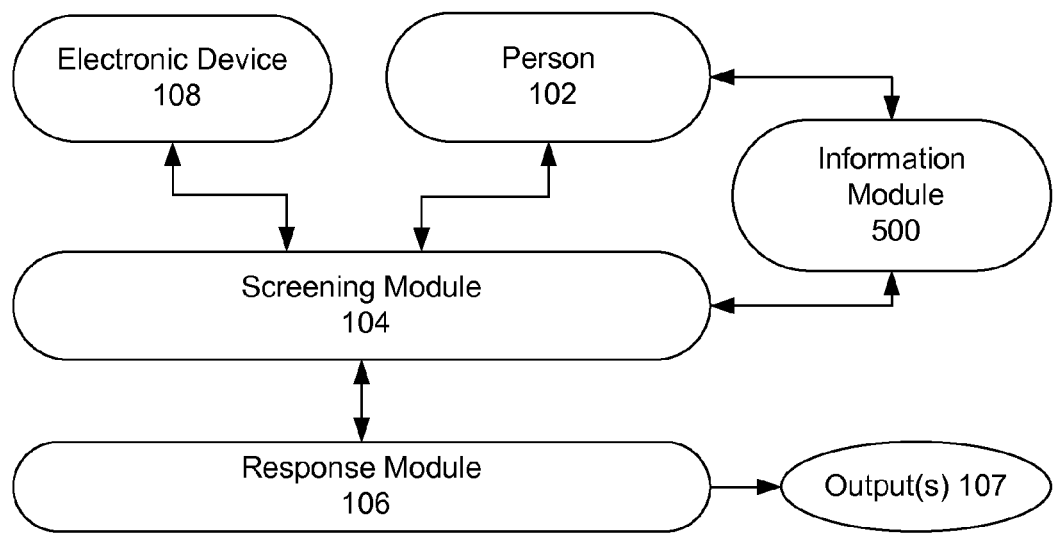
FIG. 5 illustrates a module diagram of a system to increase the reliability of electronic devices by utilizing an information module, in accordance with another embodiment of the invention.

FIG. 5 illustrates a module diagram of a system to increase the reliability of electronic devices by utilizing an information module, in accordance with another embodiment of the invention shown in FIG. 1. The screening module 104 screens the electronic device 108 for failure. The screening module 104 utilizes information from the information module 500 to determine whether the electronic device 108 has a failure and whether to activate various features of the response module 106. Response module 106 optionally advises the person 102 and may utilize one or more mechanisms existing in or near the electronic device 108. The information module 500 in some embodiments includes speech synthesis and/or speech recognition subsystems that can be integrated with little additional cost with the screening module 104 to expand the extent of the screening to include speech communication and speech analysis of the person 102. The information module 500 in one embodiment also provides historical information useful for more accurately screening the electronic device 108 for failure.

Figure 6:
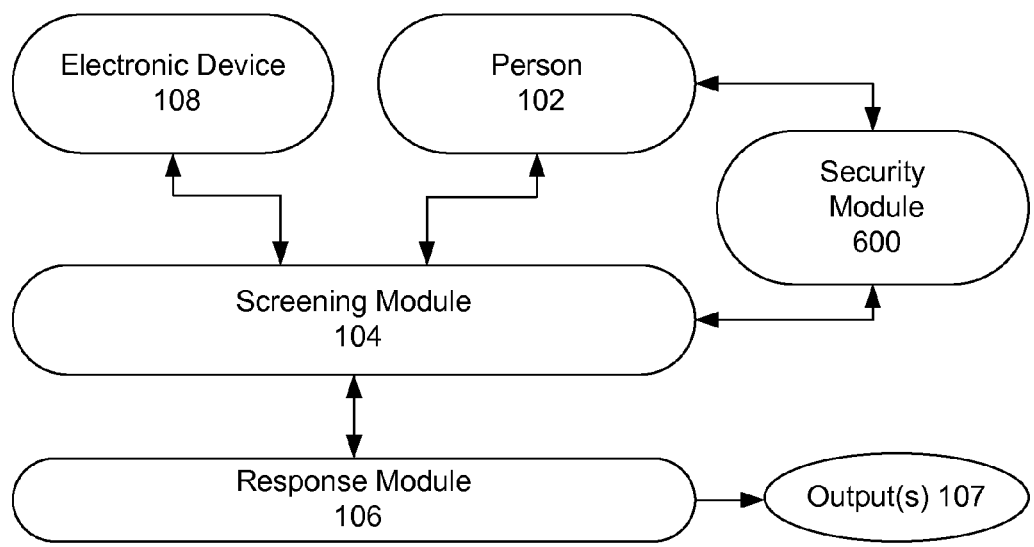
FIG. 6 illustrates a module diagram of a system to increase the reliability of electronic devices by utilizing a security module, in accordance with another embodiment of the invention.

FIG. 6 illustrates a module diagram of a system to increase the reliability of electronic devices by utilizing a security module, in accordance with another embodiment of the invention shown in FIG. 1. The screening module 104 screens the electronic device 108 for failure. The screening module 104 utilizes information from the security module 600 to determine whether the electronic device 108 has a failure and whether to activate various features of the response module 106. Response module 106 optionally advises the person 102 and may utilize one or more mechanisms existing in or near the electronic device 108. The security module 600 in some embodiments includes speech synthesis and/or speech recognition subsystems that can be integrated with little additional cost with the screening module 104 to expand the extent of the screening to include speech communication and speech analysis of the person 102. The security module 600 in one embodiment also provides historical information useful for more accurately screening the electronic device 108 for failures.

Figure 7:
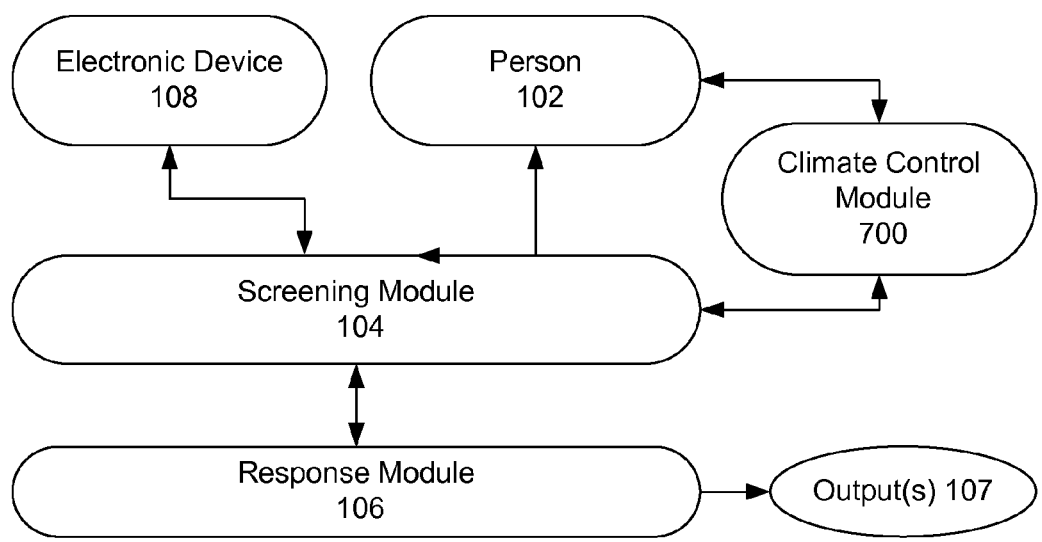
FIG. 7 illustrates a module diagram of a system to increase the reliability of electronic devices by utilizing a climate control module, in accordance with another embodiment of the invention.

FIG. 7 illustrates a module diagram of a system to increase the reliability of electronic devices by utilizing a climate control module, in accordance with another embodiment of the invention shown in FIG. 1. The screening module 104 screens the electronic device 108 for at least one failure. The screening module 104 utilizes information from the climate control module 700 to determine whether the electronic device 108 has a failure and whether to activate various features of the response module 106. Response module 106 optionally advises a person and may utilize one or more mechanisms existing in or near the electronic device 108. The climate control module 700 in some embodiments includes speech synthesis and/or speech recognition subsystems that can be integrated with little additional cost with the screening module 104 to expand the extent of the screening to include speech communication and speech analysis of the person 102. The climate control module 700 in one embodiment also provides historical information useful for more accurately screening the electronic device 108 for failure.

Figure 8:
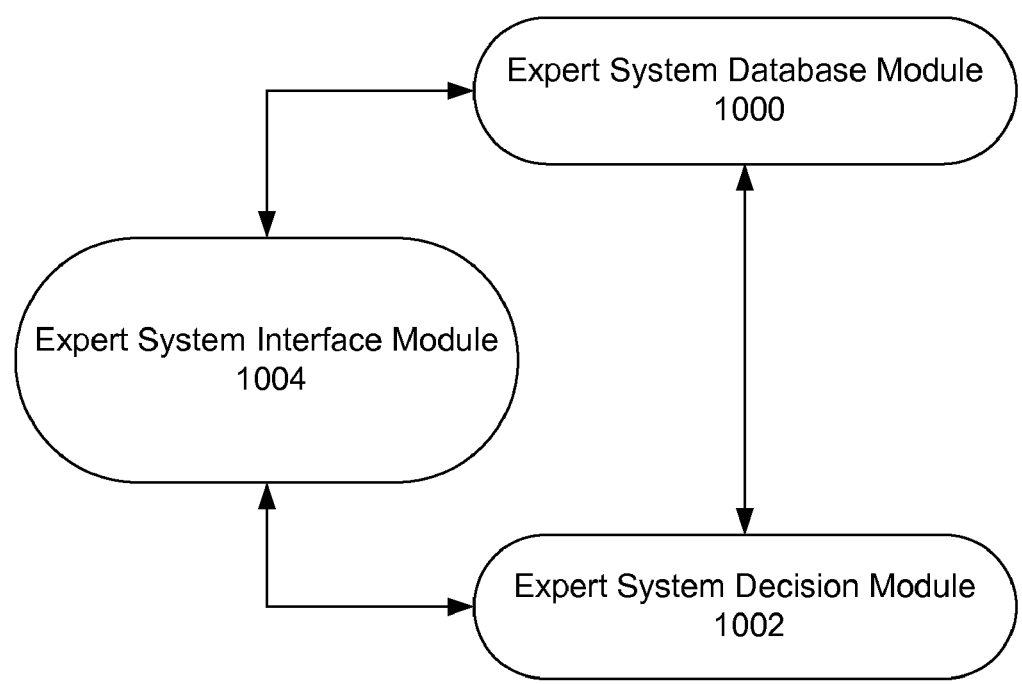
FIG. 8 illustrates an expert system implementation of the screening module shown in FIG. 1 to increase the reliability of electronic devices, in accordance with another embodiment of the invention.

FIG. 8 illustrates an expert system implementation of the screening module 104 shown in FIG. 1 to increase the reliability of electronic devices, in accordance with another embodiment of the invention. The expert system database module 1000 communicates with the expert system decision module 1002 and the expert system interface module 1004. The expert system database module 1000 stores information useful in determining at least one potential failure of the electronic device. The expert system decision module 1002 makes the actual determination of whether or not the electronic device is failing and decides which actions to take in response to the electronic device failure. The expert system interface module 1004 obtains information concerning the electronic device to determine whether or not the electronic device is failing. The information concerning the person can be obtained from measuring a characteristic of the electronic device, such as a chemical or gas in proximity to the electronic device, temperature of the electronic device, one or more electrical, optical, thermal characteristics of the electronic device, delay in response by the electronic device to a prompt, a speed of operation of the electronic device in performing at least one task, a consistency of operation of the electronic device in performing at least one task, asking a person about the conditions of the electronic device, or asking the person to perform some task. In one embodiment, the consistency of operation of the electronic device (not shown) is determined by comparison of the electronic device inputs and outputs to past electronic device inputs and outputs stored in a memory (e.g., containing time samples, look-up tables, or some history of known reliable operation of the electronic device in the past for comparison) in one or more expert system database modules 1000.

Figure 9:
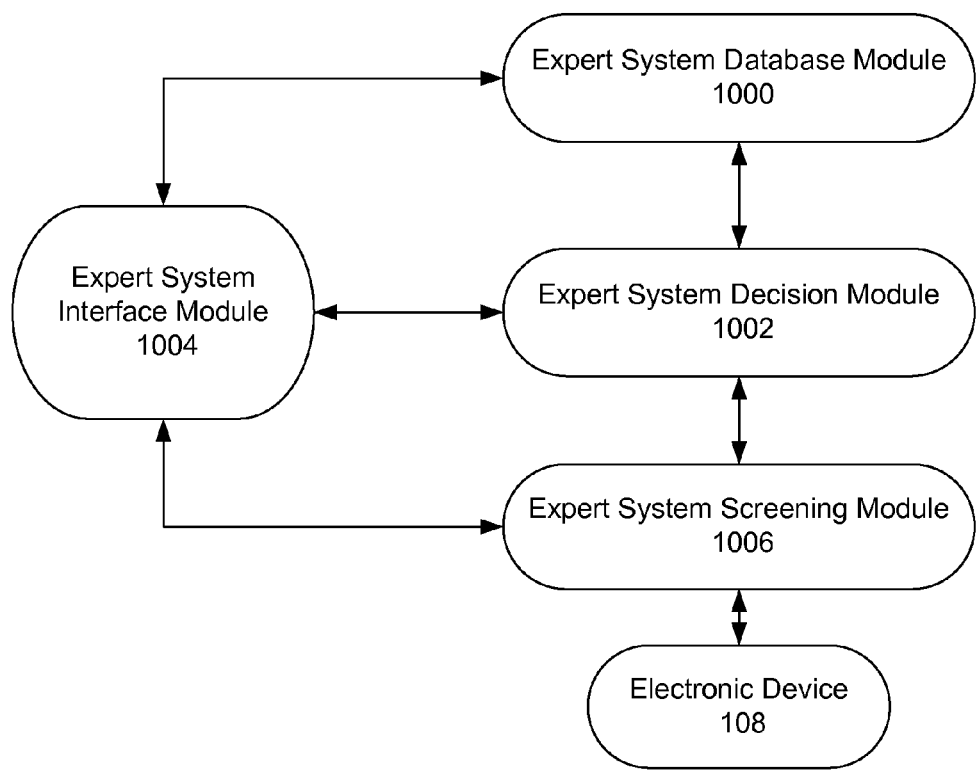
FIG. 9 illustrates an expert system implementation of the screening module shown in FIG. 1 to increase the reliability of electronic devices, in accordance with another embodiment of the invention.

FIG. 9 illustrates an expert system implementation of the screening module 104 shown in FIG. 1 to increase the reliability of electronic devices, in accordance with another embodiment of the invention. The expert system database module 1000 communicates with the expert system decision module 1002 and the expert systems interface module 1004. The expert system screening module 1006 communicates with the expert system decision module 1002 and the expert system interface module 1004. The expert system database module 1000 stores information useful in determining the failure of the electronic device 108. The expert system decision module 1002 makes the actual determination of whether or not the electronic device has failed and decides which response to make if there is failure and/or an impairment. The expert system screening module 1006 assists in screening and selectively testing the electronic device, and assists the expert system decision module 1002 in determining whether the electronic device has failed. The expert system interface module 1004 is used to obtain information concerning the potential failure of the electronic device. The expert system other factors module 1008 communicates with the expert system screening module 1006 and the expert system interface module 1004, and provides additional information that is used to adapt and/or interpret the screening of the electronic device 108 to more accurately determine whether the electronic device 108 has a failure or impairment.

Figure 10:
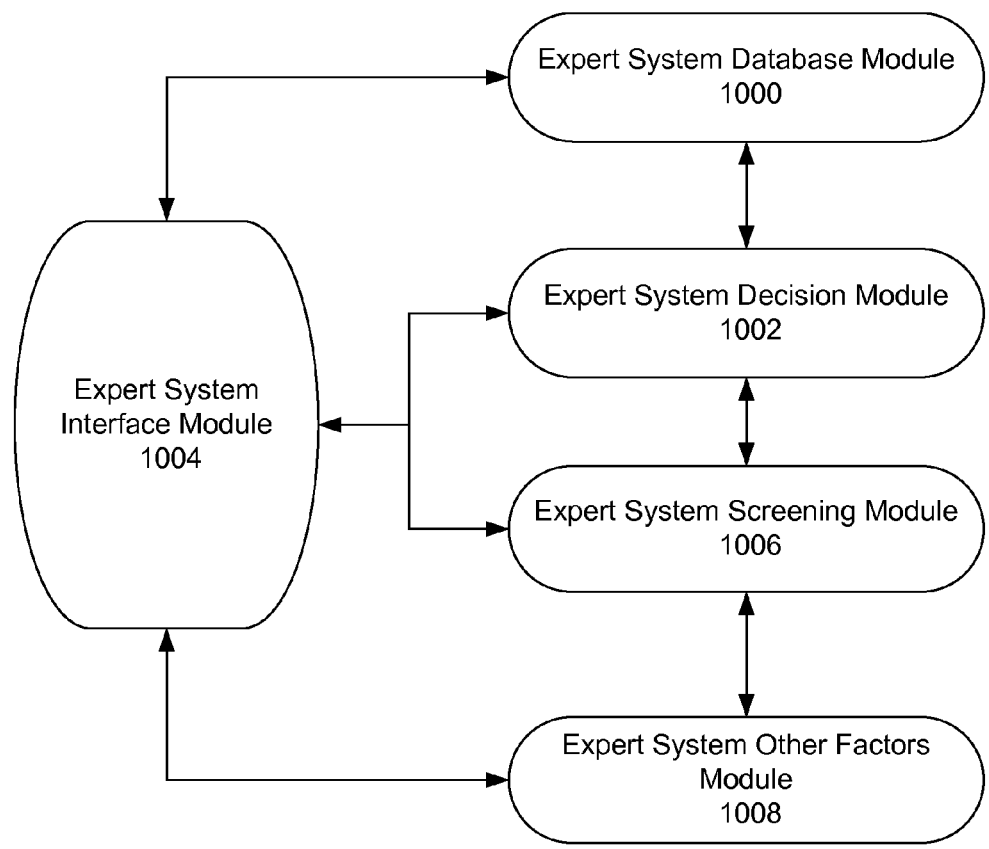
FIG. 10 illustrates an expert system implementation of the screening module shown in FIG. 1 to increase the reliability of electronic devices, in accordance with another embodiment of the invention.

FIG. 10 illustrates an expert system implementation of the screening module 104 shown in FIG. 1 to increase the reliability of electronic devices, in accordance with another embodiment of the invention. The expert system database module 1000 communicates with the expert system decision module 1002 and the expert system interface module 1004. In this embodiment, the expert system interface module 1004 resides within one or more existing modules previously listed (e.g., an operations module, an audio module, an information module, an security module, a climate control module, or an equivalent module normally associated with the mechanisms in an existing system that incorporates one or more important electronic devices.

Figure 11:
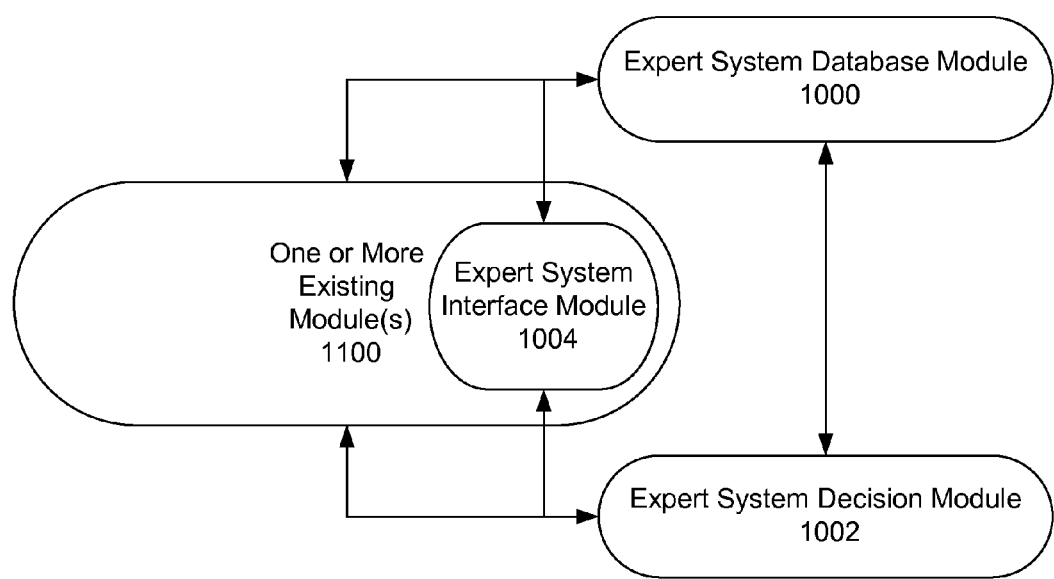
FIG. 11 illustrates an expert system implementation of the screening module shown in FIG. 1 to increase the reliability of electronic devices, in accordance with another embodiment of the invention.

FIG. 11 illustrates an expert system implementation of the screening module 104 shown in FIG. 1 to increase the reliability of electronic devices, in accordance with another embodiment of the invention. The expert system database module 1000 communicates with the expert system decision module 1002 and the expert system interface module 1004. In this embodiment, the expert system interface module 1004 resides within one or more existing modules 1100 previously listed (e.g., an operations module, an audio module, an information module, an security module, a climate control module, or an equivalent module normally associated with the mechanisms existing in or near the electronic device). For example, in one embodiment the expert system interface module 1004 resides within an operations module. In another embodiment the expert system interface module 1004 resides within an audio module. In another embodiment the expert system interface module 1004 resides within an information module.

Figure 12:
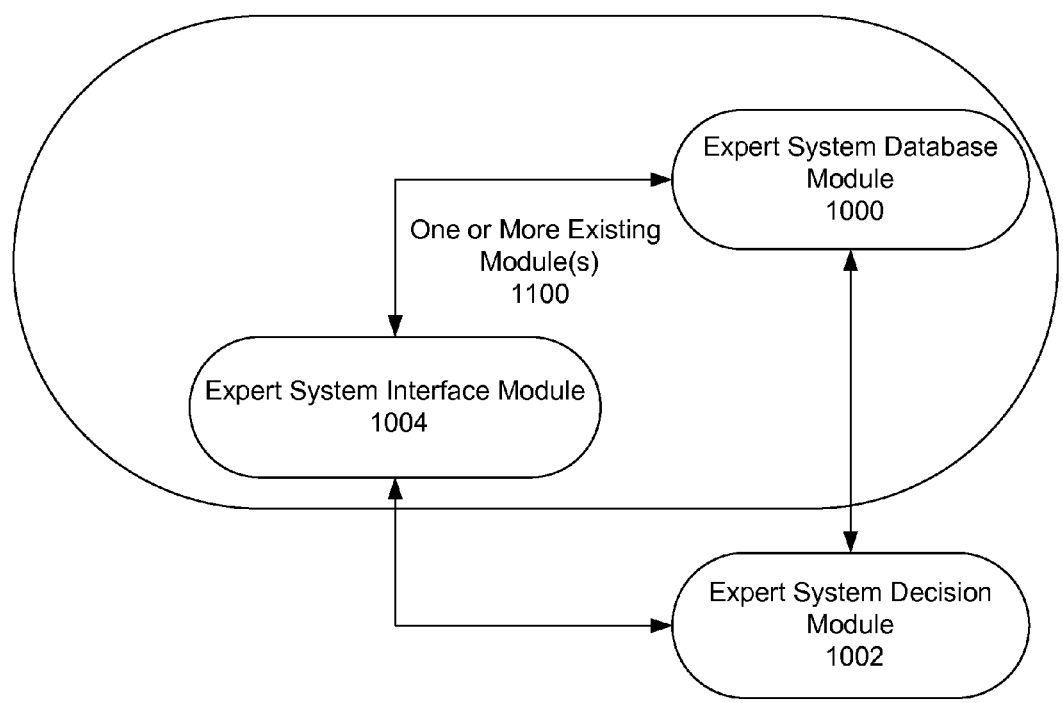
FIG. 12 illustrates an expert system implementation of the screening module shown in FIG. 1 to increase the reliability of electronic devices, in accordance with another embodiment of the invention.

FIG. 12 illustrates an expert system implementation of the screening module 104 shown in FIG. 1 to increase the reliability of electronic devices, in accordance with another embodiment of the invention. The expert system database module 1000 communicates with the expert system decision module 1002 and the expert system interface module 1004. In this embodiment, the expert system database module 1000 and the expert system interface module 1004 reside within one or more existing modules 1100 previously listed (e.g., an operations module, an audio module, an information module, an security module, a climate control module, or an equivalent module normally associated with the mechanisms existing in or near the electronic device). For example, in one embodiment the expert system database module 1000 and the expert system interface module 1004 reside within the same operations module. In another embodiment the expert system database module 1000 resides in an operations module, and the expert system interface module 1004 resides within an audio module. In another embodiment the expert system database module 1000 resides in an information module, and the expert system interface module 1004 resides within an operations module.

Figure 13:
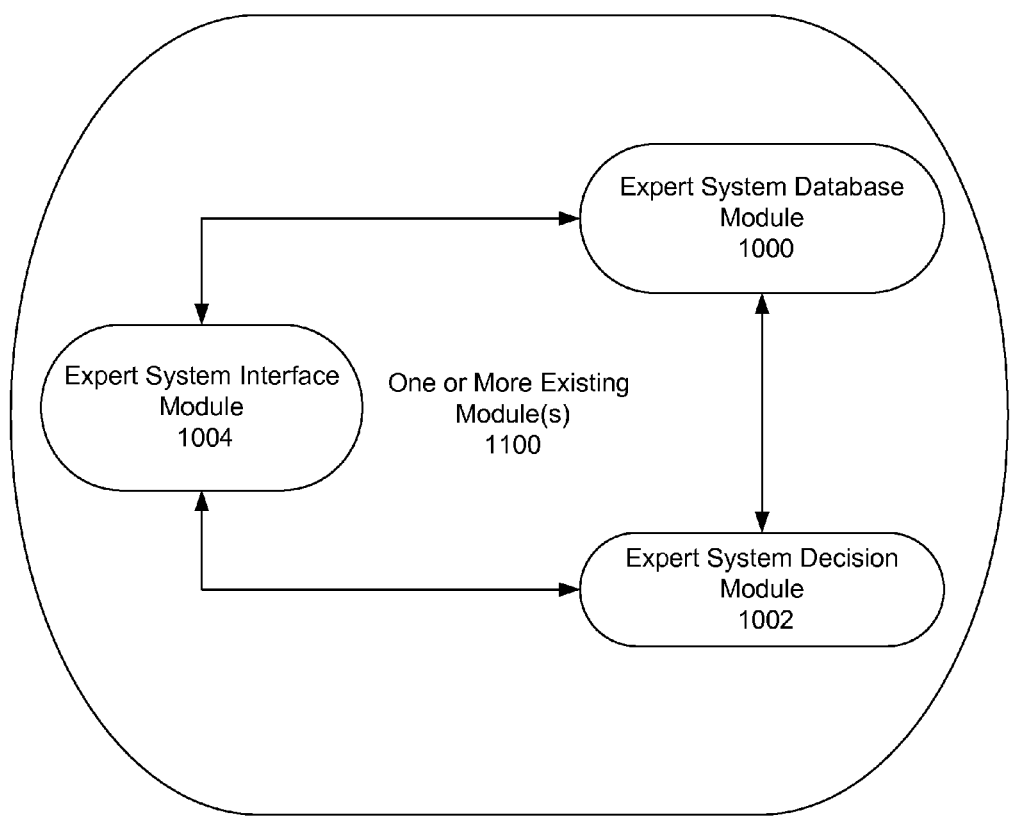
FIG. 13 illustrates an expert system implementation of the screening module shown in FIG. 1 to increase the reliability of electronic devices, in accordance with another embodiment of the invention.

FIG. 13 illustrates an expert system implementation of the screening module 104 shown in FIG. 1 to increase the reliability of electronic devices, in accordance with another embodiment of the invention. The expert system database module 1000 communicates with the expert system decision module 1002 and the expert system interface module 1004. In this embodiment, the expert system database module 1000, the expert system decision module 1002, and the expert system interface module 1004 reside within one or more existing modules 1100 previously listed (e.g., an operations module, an audio module, an information module, an security module, a climate control module, or an equivalent module normally associated with the mechanisms existing in or near the electronic device). For example, in one embodiment the expert system database module 1000, the expert system decision module 1002, and the expert system interface module 1004 all reside within the same existing modules in or near the electronic device chosen from the previous list.

In another embodiment, the three expert system modules 1000, 1002, and 1004 are spread among multiple existing modules. Less cabling and a faster response time are two advantages in locating the expert system database module 1000, the expert system decision module 1002, and the expert system interface module 1004 within the same existing module. However, there may not be enough available processor time and memory in one existing module to support the entire expert system. Furthermore, in one embodiment, the screening module 104 shown in FIG. 1 is actually composed of one or more expert systems for determining different types of electronic device failures, and portions of each expert system can be consolidated or distributed among one or more existing modules previously listed. In certain embodiments, it may actually be an advantage to have redundancy in the expert system(s) by installing one or more systems in more than one module in the event of severe damage to the mechanisms existing in or near the electronic device from some event (e.g., fire, collision, explosion, flooding, avalanche, lightning, structural failure, act of violence, earthquake, tornado, hurricane, tsunami, or volcanic eruption). In one embodiment, triple module redundancy (TMR, well-known in the prior art of fault tolerant computer technology), where at least two out of three modules must agree on a correct result before the result is relied upon, can be implemented in cases where at least one module may likely be damaged or disabled by some event, either natural or man-made.

Figure 14:
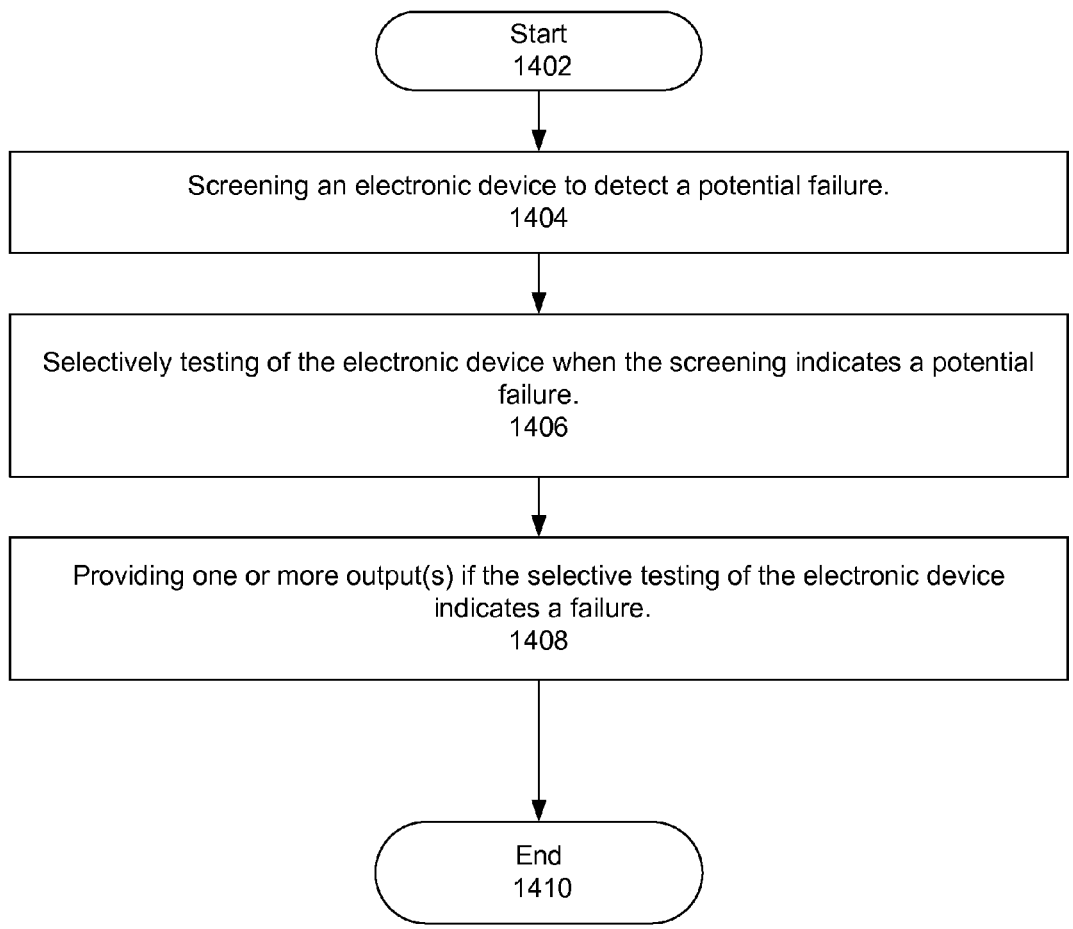
FIG. 14 illustrates a flowchart of a method to increase the reliability of electronic devices, in accordance with another embodiment of the invention.

FIG. 14 illustrates a flowchart of a method to increase the reliability of electronic devices, in accordance with another embodiment of the invention. The method starts in operation 1402. Operation 1404 is next and includes screening an electronic device to detect potential failure. Operation 1406 is next and includes selectively testing the electronic device when the screening indicates potential failure. Operation 1408 is next and includes providing one or more output(s) if the selective testing of the electronic device indicates a failure. The output(s) can include one or more of the following responses previously disclosed in more detail above: error flags, control signals to block the incorrect outputs of the electronic device, correct outputs on behalf of the electronic device, messages advising a person, control signals for mechanisms for shielding the person from harm, supplying medical drugs or other medical aid to the person, performing medical treatment on the person, increasing or decreasing air temperature in proximity to the person, increasing or decreasing the supply of appropriate gases in proximity to the person, sending a warning message to summon medical assistance, contacting other entities, activating a radio beacon, assuring the person of one or more remedial actions, rerouting communications or signals, and issuing a warning message to the person. The method ends in operation 1410.

Figure 15:
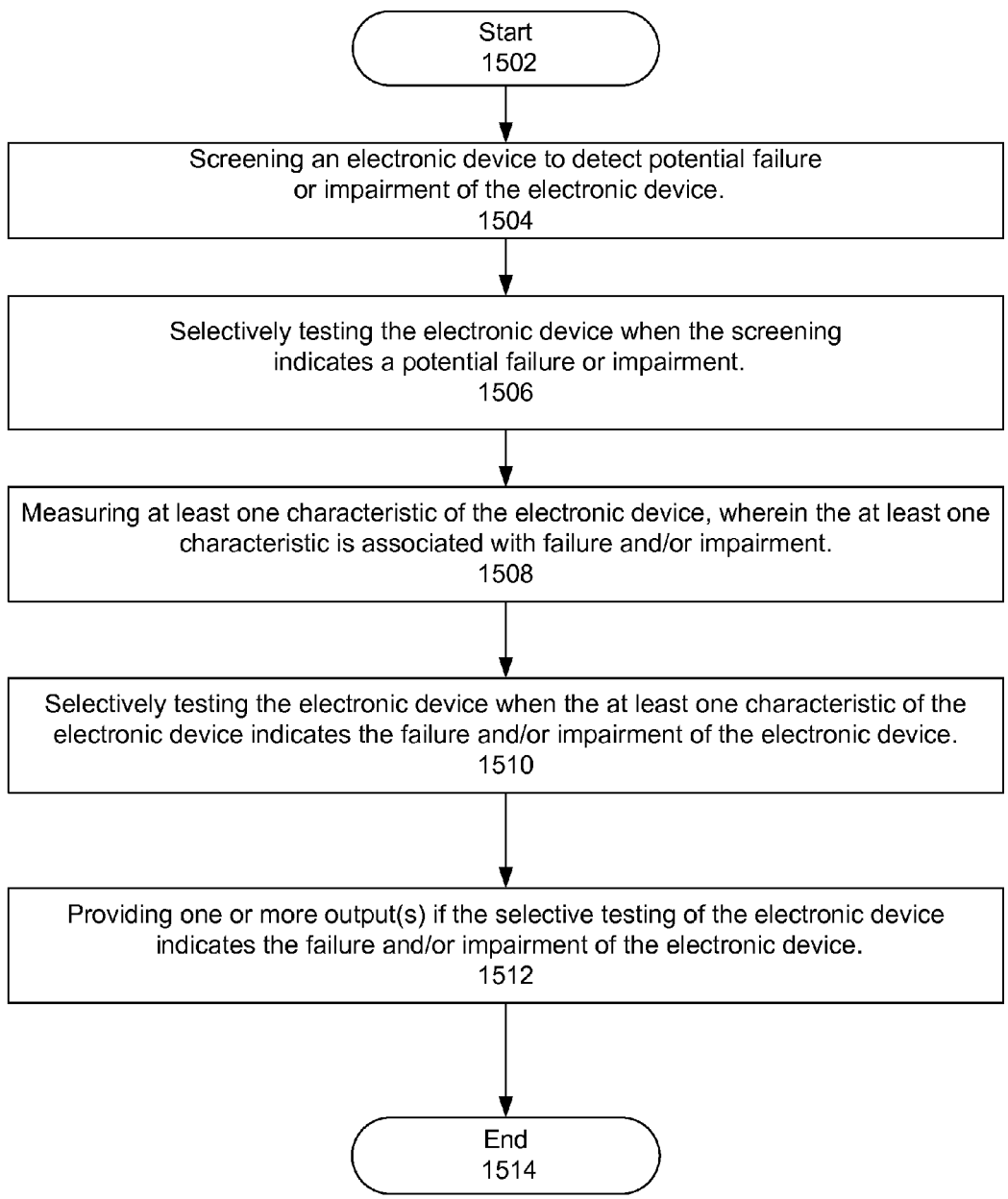
FIG. 15 illustrates a flowchart of a method to increase the reliability of electronic devices, in accordance with another embodiment of the invention.

FIG. 15 illustrates a flowchart of a method to increase the reliability of electronic devices, in accordance with one embodiment of the invention. The method starts in operation 1502. Operation 1504 is next and includes screening the electronic device for failure or impairment. Operation 1506 is next and includes selectively testing the electronic device when the screening indicates potential failure or impairment. Operation 1508 is next and includes measuring at least one characteristic of the electronic device, wherein the at least one characteristic is associated with failure and/or impairment. Operation 1510 is next and includes selectively testing the electronic device when at least one characteristic indicates the failure and/or impairment of the electronic device. Operation 1512 is next and includes providing one or more output(s) if the selective testing indicates the failure and/or impairment of the electronic device. The output(s) can include one or more of the outputs listed above, or one or more correct output(s) to replace the output(s) of the electronic device. The method ends in operation 1514.

Figure 16:
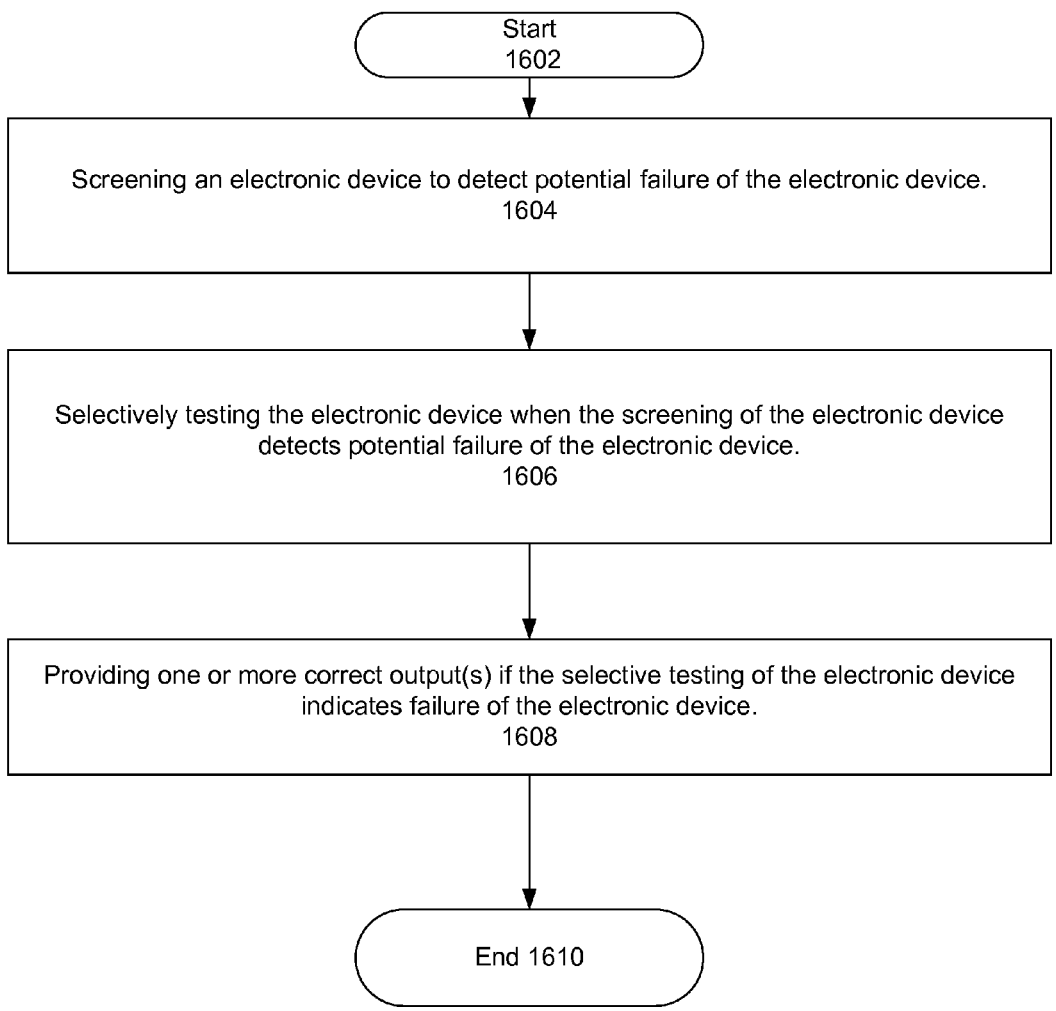
FIG. 16 illustrates another flowchart of a method to increase the reliability of electronic devices, in accordance with another embodiment of the invention.

FIG. 16 illustrates another flowchart of a method to increase the reliability of electronic devices, in accordance with one embodiment of the invention. The method starts in operation 1602. Operation 1604 is next and includes screening an electronic device to detect potential failure. Operation 1606 is next and includes selectively testing the electronic device when the screening of the electronic device detects potential failure. Operation 1608 is next and includes providing one or more correct output(s) if the selective testing of the electronic device indicates failure. The output(s) can include one or more of the output(s) listed above. The method ends in operation 1610.

Other embodiments of the invention are possible. For example, other factors could be considered in screening the electronic device, such as shaking or sudden starts or stops of the mechanisms existing near the electronic device, or wild fluctuations in the operation of one or more modules previously listed. Another embodiment can deny people entry through the doors of enclosed locations (e.g., power plants, utility plants, government facilities, educational facilities, department stores, and so forth).

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method to increase electronic device reliability, comprising:
   screening an electronic device by one or more expert systems without requiring human interaction to detect a potential failure, wherein said screening includes measuring at least one characteristic of said electronic device;
   selectively testing said electronic device without requiring human interaction when said screening indicates a potential failure; and
   providing one or more output(s) if said selective testing of said electronic device indicates said failure.

2. The method of claim 1, wherein said screening of said electronic device includes utilization of information derived from one or more existing modules coupled to said electronic device.

3. The method of claim 1, further comprising:
   allowing a person to activate a screening for failure of said electronic device by one or more expert systems.

4. The method of claim 1, further comprising measuring at least one characteristic of said electronic device.

5. The method of claim 1, wherein said selective testing of said electronic device includes utilization of information derived from one or more existing modules.

6. The method of claim 1, wherein said output(s) include providing one or more responses selected from the group of responses consisting of: outputting an error flag regarding said electronic device, outputting a correct output, advising a person of the safest evacuation route or a safer evacuation route from a location, advising said person of a second location having less failure or having emergency supplies, shielding said person from harm, changing a posture of said person, supplying medical drugs or other medical aid to said person, performing medical treatment on the impaired person, increasing or decreasing air temperature in proximity to said person, increasing or decreasing a supply of appropriate gases in proximity to said person, sending a warning message to summon medical assistance, contacting other entities, activating a radio beacon, assuring said person of one or more remedial actions, speaking to said person in response to panic, terror or anxiety of said person, disabling equipment at said location, shutting off power to said equipment at said location, limiting operation of said equipment at said location to a lower speed of operation, autonomously moving said equipment at said location to a second location, activating an alarm, sending a warning message to another entity for assistance, rerouting communications or signals, and issuing a warning message to said person.

7. The method of claim 1, wherein said selective testing utilizes one or more other factors selected from the group of factors consisting of: air temperature, oxygen level, carbon dioxide level, carbon monoxide levels, combustion by-product levels, nitrous oxide levels, ozone levels, hydrocarbon vapor levels, the presence of gas associated with electronic device failure, air humidity, air pressure, collisions, explosions, environmental decompression or compression, fires, sound loudness levels in proximity to a module, radiation, and a history of said electronic device.

8. A method to increase the reliability of an electronic device, comprising:
   screening an electronic device by one or more expert systems without requiring human interaction to detect a potential failure, wherein said screening includes measuring at least one characteristic of said electronic device;

selectively testing said electronic device without requiring human interaction when said screening of said electronic device detects a potential failure; and providing a correct output to replace an incorrect output from said electronic device if said selective testing of said electronic device indicates said failure.

9. The method of claim 8, wherein said screening of said electronic device includes utilization of at least a portion of one or more existing modules.

10. The method of claim 8, wherein said screening of said electronic device includes a time-sharing allocation of at least one processor executing at least one expert system.

11. The method of claim 8, further comprising:
allowing one or more people to activate a screening for failure of said electronic device by one or more expert systems.

12. The method of claim 8, further comprising measuring at least one characteristic of said electronic device.

13. The method of claim 8, wherein said selective testing of said electronic device includes utilization of at least a portion of one or more existing modules selected from the group of existing modules consisting of: an operations module, an audio module, an information module, a security module, and a climate control module.

14. The method of claim 8, wherein said one or more correct output(s) also include one or more responses selected from the group of responses consisting of: advising a person of the safest evacuation route or a safer evacuation route from a location, advising said person of a second location having less failure or having emergency supplies, shielding said person from harm, changing a posture of said person, supplying medical drugs or other medical aid to said person, performing medical treatment on said impaired person, increasing or decreasing air temperature in proximity to said person, increasing or decreasing the supply of appropriate gases in proximity to said person, sending a warning message to summon medical assistance, contacting other entities, activating a radio beacon, assuring said person of one or more remedial actions, speaking to said person in response to panic, terror or anxiety of said person, disabling equipment at said location, shutting off power to said equipment at said location, limiting operation of said equipment at said location to a lower speed of operation, autonomously moving said equipment at said location to a second location, activating an alarm, sending a warning message to another entity for assistance, rerouting communications or signals, and issuing a warning message to said person.

15. The method of claim 8, wherein said selective testing of said electronic device includes a time-sharing allocation of one or more processors of one or more existing modules executing one or more expert systems.

16. The method of claim 8, wherein said selective testing selectively changes according to one or more other factors selected from the group of factors consisting of: air temperature, oxygen level, carbon dioxide level, carbon monoxide levels, combustion by-product levels, nitrous oxide levels, ozone levels, hydrocarbon vapor levels, the presence of any gas associated with electronic device failure, air humidity, air pressure, collisions, explosions, environmental decompression or compression, fires, sound loudness levels, radiation, and an operational history of said electronic device.

17. A system to increase the reliability of an electronic device, comprising:
a screening module to detect potential failure of an electronic device without requiring human interaction and selectively test said electronic device without requiring human interaction when said screening detects a potential failure, wherein said screening module includes at least one module to measure at least one characteristic of said electronic device, wherein said screening module utilizes one or more expert system modules in screening said electronic device; and
a response module to provide an output if said selective test of said electronic device indicates said failure.

18. The system of claim 17, wherein said screening module includes one or more expert system modules that utilize at least a portion of one or more modules selected from the group of modules consisting of: an operations module, an audio module, an information module, a security module, and a climate control module.

19. The system of claim 17, wherein said response module also provides one or more responses selected from the group of responses consisting of: outputting a correct output, advising a person of the safest evacuation route or a safer evacuation route from a location, advising said person of a second location having less failure or having emergency supplies, shielding said person from additional harm, changing a posture of said person, supplying medical drugs or other medical aid to said person, performing medical treatment on said person, increasing or decreasing air temperature in proximity to said person, increasing or decreasing the supply of appropriate gases in proximity to said person, assuring said person of one or more remedial actions, speaking to said person in response to panic, terror or anxiety of said person, disabling equipment at said location, shutting off power to said equipment at said location, limiting operation of said equipment at said location to a lower speed of operation, activating an alarm, sending a warning message to another entity for assistance, rerouting communications or signals, and issuing a warning message to said person.

20. The system of claim 17, wherein said screening module includes at least one module to measure at least one characteristic of said electronic device selected from the group of characteristics consisting of: at least one chemical in proximity to said electronic device, temperature in proximity to said electronic device, delay in response by said electronic device to a prompt, a speed of operation of said electronic device in performing at least one task, and a consistency of operation of said electronic device in performing at least one task.

\* \* \* \* \*